US006949977B2

United States Patent
Macciocchi

(10) Patent No.: US 6,949,977 B2
(45) Date of Patent: Sep. 27, 2005

(54) CIRCUIT ARRANGEMENT HAVING A TRANSIMPEDANCE AMPLIFIER CONNECTED TO A CURRENT LIMITER CIRCUIT

(75) Inventor: Fred E. Macciocchi, Huntley, IL (US)

(73) Assignee: Siemens Medical Solutions, USA, Malvern, PA (US)

( * ) Notice: Subject to any disclaimer, the term of this patent is extended or adjusted under 35 U.S.C. 154(b) by 135 days.

(21) Appl. No.: 10/606,595

(22) Filed: Jun. 26, 2003

(65) Prior Publication Data

US 2004/0263250 A1 Dec. 30, 2004

(51) Int. Cl.[7] .................................................. H03F 1/52
(52) U.S. Cl. .................................. 330/207 P; 330/291
(58) Field of Search .............................. 330/207 P, 291

(56) References Cited

U.S. PATENT DOCUMENTS

| 4,791,314 | A | * | 12/1988 | Kuo et al. ..................... 326/32 |
| 4,952,795 | A | * | 8/1990 | Gauthier et al. ........ 250/214 A |
| 4,956,565 | A | * | 9/1990 | Bahlmann .................... 327/108 |
| 5,761,317 | A | * | 6/1998 | Pritchard ...................... 381/61 |
| 6,108,183 | A | * | 8/2000 | Beene ........................ 361/93.8 |
| 6,127,885 | A | * | 10/2000 | Colangelo .................... 330/10 |

* cited by examiner

Primary Examiner—Patricia Nguyen

(57) ABSTRACT

A circuit arrangement is provided which has the advantage of limiting the magnitude of the current to a transimpedance amplifier (TIA) circuit or a current to voltage converter during an overdrive condition, thereby preventing an amplifier of the TIA circuit from non-linear operation and from outputting high output currents. The circuit arrangement further prevents the generation of thermal tails which may cause the loss of data in memory circuits. The circuit arrangement limits the magnitude of the current to the TIA circuit during the overdrive condition by utilizing a current limiter circuit having a Schottky bridge. The Schottky bridge provides an open circuit arrangement between the TIA circuit and a current source when the overdrive condition occurs.

20 Claims, 1 Drawing Sheet

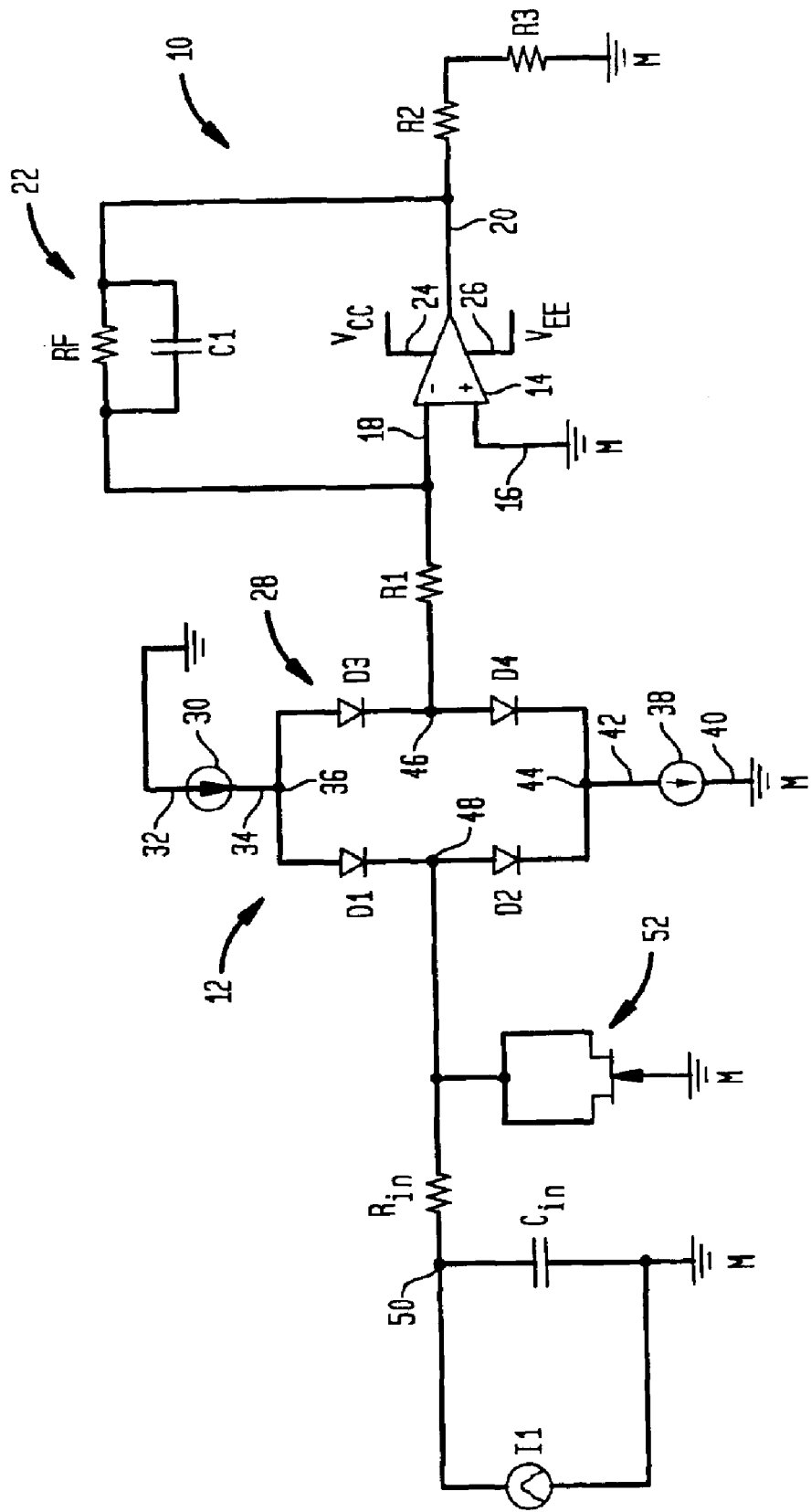

CIRCUIT ARRANGEMENT HAVING A TRANSIMPEDANCE AMPLIFIER CONNECTED TO A CURRENT LIMITER CIRCUIT

BACKGROUND OF THE INVENTION

1. Field of the Invention

This invention relates generally to transimpedance amplifiers (TIAs) and, in particular, to a circuit arrangement having a transimpedance amplifier (TIA) connected to a current limiter circuit for limiting current to the TIA during an overdrive condition.

2. Description of the Related Art

A current to voltage converter or transimpedance amplifier (TIA) is used with a current source to condition or change a current signal to allow further processing of the current signal. Typically, photons are converted to current using a photomultiplier tube or photodiode and the current is then converted to a voltage in the TIA. The gain of the TIA is proportional to its feedback resistor and is subject to overdrive when the current signal exceeds a set limit. When an overdrive condition occurs, the TIA enters a non-linear saturated condition that requires time to recover and return to the linear mode of operation.

Overdrive conditions in a TIA generally occur when cosmic rays strike a scintillator or from Fresnel reflections in optical time domain reflectometry. The overdrive signals can be on the order of 60 dB or a factor of 1000 times greater than the normal signal of interest.

Prior art TIA circuit arrangements limit the current the TIA is forced to respond to during an overdrive condition by feeding back a TIA output signal to an input terminal of the TIA to provide clamping. Nonetheless, by feeding back a TIA output signal to an input terminal of the TIA, the TLA generally still enters the non-linear saturated condition. This operational condition can cause, especially in a monolithic integrated circuit, the generation of a thermal tail. A thermal tail is defined as the time required for a TIA operating in a non-linear saturated condition to recover and return to the linear mode of operation. The generation of the thermal tail slows down the operation of the TIA and can also lead to a loss of data in memory circuits.

Therefore, it is an aspect of the invention to provide a circuit arrangement for limiting the magnitude of the current the TIA is forced to respond to during an overdrive condition. Further, it is another aspect of the invention to prevent high output currents and non-linear operation of a TIA during an overdrive condition. The latter will prevent the generation of thermal tails during the operation of a TIA.

SUMMARY OF THE INVENTION

With the foregoing and other aspects in view there is provided, in accordance with the invention, a circuit arrangement having an input terminal to which an input current is applied; an output terminal to which an output voltage is applied; a transimpedance amplifier (TIA) circuit connected to the output terminal; and an overdrive limiter circuit serially connected to the TIA circuit which receives the input current from the input terminal. The overdrive limiter circuit has at least one switch for providing an open circuit arrangement between a current source and the TIA circuit when an overdrive condition occurs. The open circuit arrangement limits the amount of current within the TIA circuit and prevents non-linear operation of an amplifier of the TIA circuit during the overdrive condition.

The overdrive limiter circuit includes first and second current sources having a respective first terminal connected to ground and a Schottky bridge. The Schottky bridge includes the at least one switch, a first terminal connected to a second terminal of the first current source, and a second terminal connected to a second terminal of the second current source. During operation of the circuit arrangement, a bias current is applied to the Schottky bridge by the first and second current sources. The bias current sets the maximum current the TIA circuit can provide to the current source and the maximum output voltage the TIA circuit can output via the output terminal. The overdrive limiter circuit further includes a diode having a first terminal connected to ground and a second terminal connected to the input terminal for supplying current to the current source when the overdrive condition occurs.

The at least one switch of the Schottky bridge includes four diodes. A first pair of diodes is serially connected and parallel to a second pair of serially connected diodes. The cathodes of a first of the first pair of diodes and a second of the second pair of diodes are commonly connected to the second terminal of the first current source. The anodes of a second of the first pair of diodes and a second of the second pair of diodes are commonly connected to the second terminal of the second current source.

The amplifier of the TIA circuit includes a first amplifier input terminal connected to the overdrive limiter circuit via an intermediate resistor, a second amplifier input terminal connected to ground, and an amplifier output terminal connected to the output terminal. The TIA circuit further includes an RC feedback network having a feedback resistor having a resistor input terminal connected to the first amplifier input terminal and having a resistor output terminal connected to the amplifier output terminal; and a capacitor connected in parallel to the feedback resistor.

The circuit arrangement according to the invention has the advantage of limiting the magnitude of the current to the TIA circuit during the overdrive condition, thereby preventing the amplifier of the TIA circuit from non-linear operation and from outputting high output currents. The circuit arrangement according to the invention further prevents the generation of thermal tails which slows down operation of prior art TIA circuits and tends to cause the loss of data in memory circuits.

BRIEF DESCRIPTION OF THE DRAWING

The FIGURE of the drawing is a schematic circuit diagram of an exemplary embodiment of the invention.

DETAILED DESCRIPTION OF THE PREFERRED EMBODIMENTS

Referring now to the single FIGURE of the drawing in detail, there is seen an exemplary embodiment of a circuit arrangement according to the invention having a transimpedance amplifier (TIA) circuit 10 serially connected to an overdrive limiter circuit 12 or overdrive sensing or detecting circuit via an intermediate resistor R1. The circuit arrangement can be referred to as a transimpedance amplifier-current limiter circuit (TIA-CLC).

The TIA circuit 10 includes an amplifier 14, which, by way of example, is constructed as an operational amplifier in the FIGURE, and an RC network 22. A ground potential M is connected to a non-inverting input terminal 16 of the amplifier 14. An inverting input terminal 18 of the amplifier 14 is serially connected to the overdrive limiter circuit 12 via the intermediate resistor R1. The intermediate resistor R1 has a resistance of approximately 100 ohms. An output terminal 20 of the amplifier 14 forms an output terminal of the circuit arrangement. The output terminal 20 is serially connected to two load resistors R2 and R3 both having a resistance of approximately 75 ohms. The ground potential M is connected to the two load resistors R2 and R3 at an opposite end of the output terminal 20.

The output terminal 20 of the amplifier 14 is connected to the input terminal 18 of the amplifier 14 via a feedback resistor RF of the TIA circuit 10. The feedback resistor RF is connected in parallel to a capacitor C1 forming the RC network 22. The feedback resistor RF has a resistance of approximately 10,000 ohms and the capacitor C1 has a capacitance of approximately one picofarad. Two operating voltages $V_{CC}$ and $V_{EE}$ are provided to the amplifier 14 via voltage input terminals 24 and 26, respectively.

The overdrive limiter circuit 12 includes a Schottky bridge 28, a first bias current source 30 having a first terminal 32 connected to the ground potential M and a second terminal 34 connected to a first terminal 36 of the Schottky bridge 28, and a second bias current source 38 having a first terminal 40 connected to the ground potential M and a second terminal 42 connected to a second terminal 44 of the Schottky bridge 28.

Each of the two bias current sources 30, 38 provide a bias current of 100 uA to the Schottky bridge 28. This bias current sets the maximum current the TIA circuit 10 can provide to a current source I1 and the maximum output voltage Vout the amplifier 14 can output via output terminal 20, where Vout=I1×RF. This is the transfer function of the TIA circuit 10 and can be measured at the junction of RF and R2. In the circuit arrangement shown by the FIGURE, if the current source I1 provides a current of 10 uA, then the output voltage Vout is 10 uA×10,000 ohms or 100 mV. This is well within the linear operating range of the TIA circuit 10 and no overdrive condition occurs.

One can adjust the current values of the bias current sources 30, 38 for adjusting the clamping current level. Preferably, the both bias current sources 30, 38 are matched, thereby providing the same current level.

The Schottky bridge 28 is formed with four diodes D1–D4. Preferably, the Schottky bridge 28 is a monolithic unit that allows matching of diode parameters over temperature. A first pair of diodes, i.e., diodes D1 and D2, is serially connected and a second pair of diodes, i.e., diodes D3 and D4, is serially connected. The first and second pair of diodes are connected in parallel as shown in the FIGURE. Diodes D1 and D3 are coupled at the first terminal 36 and diodes D2 and D4 are coupled at the second terminal 44. Intermediate resistor R1 is coupled to the Schottky bridge 28 at a junction 46 between diodes D3 and D4.

An input resistor Rin is coupled to the Schottky bridge 28 at a junction 48 between diodes D1 and D2. The input resistor Rin is also coupled to the current source I1 and a capacitor Cin at junction 50. The input resistor Rin has a resistance of approximately 2,000 ohms and the capacitor Cin has a capacitance of approximately 14 picofarads. The capacitor Cin and the current source I1 are also coupled to the ground potential M.

Also coupled to the Schottky bridge 28 at the junction 48 is a transistor 52. The input resistor Rin, the intermediate resistor R1, and/or the transistor 52 can be part of the overdrive limiter circuit 12 when the overdrive limiter circuit 12 is a monolithic circuit. The transistor 52 is preferably a junction field-effect transistor (JFET) and is diode connected, i.e., configured to as a reverse-biased diode until the overdrive condition exists. The transistor 52 can also be the collector base junction of a bipolar NPN transistor.

The JFET and the bipolar NPN provide extremely low leakage currents to the circuit over a large temperature range. The leakage current of the transistor 52 in the circuit arrangement shown by the FIGURE is 60 dB lower than a typical junction signal diode, such as a BAS32 diode, for example. The Schottky bridge diodes D1–D4 and the transistor 52 preferably have low capacity so as to not degrade high frequency performance of the TIA circuit 10.

The function of the diode-connected transistor 52 is to supply additional current to the current source I1 during the overdrive condition. During the overdrive condition, the current source I1 in the exemplary circuit arrangement shown by the FIGURE requires a current of 1000×10 uA or 10 mA.

The overdrive condition is sensed or detected by the overdrive limiter circuit 12 in the circuit arrangement shown by the FIGURE when the overdrive limiter circuit 12 receives a current of 100 uA from the TIA circuit 10 at junction 46. When a current of 100 uA is received at junction 46, an open circuit arrangement is provided by the Schottky bridge 28. The open circuit arrangement effectively disconnects the TIA circuit 10 from the current source I1, thereby clamping the current being fed to the TIA circuit 10. The current is clamped until a lower current is received at junction 46 indicating the non-presence of the overdrive condition.

As described in detail above, the circuit arrangement according to the invention has the advantage of limiting the magnitude of the current to the TIA circuit 10 during the overdrive condition, thereby preventing the amplifier 14 of the TIA circuit 10 from non-linear operation and from outputting high output currents. Therefore, the circuit arrangement according to the invention prevents the generation of thermal tails which slows down operation of prior art TIA circuits and tends to cause the loss of data in memory circuits.

Although the invention is illustrated and described herein as embodied in the circuit arrangement shown by the FIGURE, it is nevertheless not intended to be limited to the details shown, since various modifications and structural changes may be made therein without departing from the spirit of the invention and within the scope and range of equivalents of the claims.

What is claimed is:

1. A circuit arrangement compromising:
   an input terminal to which an input current is applied;
   an output terminal to which an output voltage is applied;
   a transimpedance amplifier circuit connected to said output terminal; and
   an overdrive limiter circuit serially connected to said transimpedance amplifier circuit which receives said input current from said input terminal, said overdrive limiter circuit having at least one switch for providing an open circuit arrangement between a current source directly connected to ground and said transimpedance amplifier circuit when an overdrive condition occurs.

2. The circuit arrangement according to claim 1, further comprising a resistor serially connected to said transimpedance amplifier circuit and said overdrive limiter circuit at an intermediate point.

3. The circuit arrangement according to claim 1, wherein said overdrive limiter circuit comprises:
   first and second current sources having a respective first terminal connected to ground; and
   a Schottky bridge having the at least one switch and further having a first terminal connected to a second terminal of the first current source, said Schottky bridge having a second terminal connected to a second terminal of the second current source, wherein a bias current is applied to said Schottky bridge by said first and second current sources, and wherein said bias current sets the maximum current the transimpedance amplifier circuit can provide to the current source and the maximum output voltage the transimpedance amplifier circuit can output via said output terminal.

4. The circuit arrangement according to claim 3, wherein said overdrive limiter circuit further comprises a diode having a first terminal connected to ground and a second terminal connected to said input terminal for supplying current to the current source when said overdrive condition occurs.

5. The circuit arrangement according to claim 4, wherein said diode comprises one of a junction field-effect transistor and a NPN transistor.

6. The circuit arrangement according to claim 3, wherein the at least one switch of said Schottky bridge includes four diodes, wherein a first pair of diodes is serially connected and parallel to a second pair of serially connected diodes, wherein the cathodes of a first of the first pair of diodes and a second of the second pair of diodes are commonly connected to the second terminal of the first current source, and wherein the anodes of a second of the first pair of diodes and a second of the second pair of diodes are commonly connected to the second terminal of the second current source.

7. The circuit arrangement according to claim 1, wherein said transimpedance amplifier circuit comprises:
   an amplifier having a first amplifier input terminal connected to said overdrive limiter circuit via an intermediate resistor, a second amplifier input terminal connected to ground, and an amplifier output terminal connected to said output terminal; and
   an RC feedback network comprising:
      a feedback resistor having a resistor input terminal connected to said first amplifier input terminal and having a resistor output terminal connected to said amplifier output terminal; and
      a capacitor connected in parallel to said feedback resistor.

8. The circuit arrangement according to claim 7, wherein the intermediate resistor and the feedback resistor have resistances of approximately 100 and 10,000 ohms, respectively, and wherein the capacitor has a capacitance of approximately one picofarad.

9. The circuit arrangement according to claim 1, further comprising two serially arranged load resistors connected to said output terminal and both having resistances of approximately 75 ohms.

10. An overdrive limiter circuit arrangement comprising:
    an amplifier circuit having at least one amplifier;
    an overdrive sensing circuit comprising a switching network serially connected to said amplifier circuit for sensing an overdrive condition and providing an open circuit arrangement between a current source and said amplifier circuit for limiting the current provided to said at least one amplifier during said overdrive condition; and
    a resistor serially connected to said amplifier circuit and said overdrive sensing circuit at an intermediate point.

11. The overdrive limiter circuit according to claim 10, wherein said switching network is a Schottky bridge, wherein said overdrive sensing circuit further comprises first and second current sources for applying a bias current to said Schottky bridge, and wherein said bias current sets the maximum current the at least one amplifier can provide to the current source and the maximum output voltage the at least one amplifier can output via an output terminal.

12. The overdrive limiter circuit according to claim 11, wherein the Schottky bridge includes a first and second pair of diodes, wherein the first pair of diodes is serially connected and parallel to the second pair of serially connected diodes, wherein the cathodes of a first of the first pair of diodes and a first of the second pair of diodes are commonly connected to a terminal of the first current source, and wherein the anodes of a second of the first pair of diodes and a second of the second pair of diodes are commonly connected to a terminal of the second current source.

13. The overdrive limiter circuit according to claim 10, wherein said overdrive sensing circuit further comprises a diode having a first terminal connected to ground and a second terminal connected to an input terminal of said overdrive limiter circuit, said diode supplying current to the current source when said overdrive condition occurs.

14. The overdrive limiter circuit according to claim 13, wherein said diode comprises one of a junction field-effect transistor and a NPN transistor.

15. The overdrive limiter circuit according to claim 10, wherein said amplifier circuit is a transimpedance amplifier circuit.

16. The overdrive limiter circuit according to claim 15, wherein said transimpedance amplifier circuit comprises:
    a first amplifier input terminal connected to said overdrive sensing circuit via an intermediate resistor, a second amplifier input terminal connected to ground, and an amplifier output terminal connected to an output terminal; and an RC feedback network comprising:
- a feedback resistor having a resistor input terminal connected to said first amplifier input terminal and having a resistor output terminal connected to said amplifier output terminal; and
- a capacitor connected in parallel to said feedback resistor.

17. The overdrive limiter circuit according to claim 16, wherein the intermediate resistor and the feedback resistor have resistances of approximately 100 and 10,000 ohms, respectively, and wherein the capacitor has a capacitance of approximately one picofarad.

18. The overdrive limiter circuit according to claim 10, further comprising two serially arranged load resistors connected to an output terminal of said overdrive limiter circuit and both resistors having resistances of approximately 75 ohms.

19. A transimpedance amplifier-current limiter circuit comprising:
- a current limiter circuit comprising:
  - a Schottky bridge having a first and a second pair of diodes, wherein the first pair of diodes are serially connected and parallel to the second pair of serially connected diodes; and
  - first and second current sources connected to the Schottky bridge and directly connected to ground, wherein a terminal of the first current source is connected to the cathodes of a first of the first pair of diodes and a first of the second pair of diodes, and wherein a terminal of the second current source is connected to the anodes of a second of the first pair of diodes and a second of the second pair of diodes; and
- a transimpedance amplifier circuit serially connected to said current limiter circuit, said transimpedance amplifier circuit comprising:
  - an amplifier having input and output terminals, said input terminal being serially connected to the Schottky bridge; and
  - an RC feedback network connected to the input terminal and the output terminal search that said RC feedback network is connected in parallel to the amplifier;
- wherein said Schottky bridge limits the current to the amplifier when an overdrive condition occurs by providing an open circuit arrangement between the amplifier and a current source.

20. The transimpedance amplifier according to claim 19, further comprising a diode baying a first terminal connected to ground and a second terminal connected to an input terminal of said Schottky bridge, said diode supplying current to the current source when said overdrive condition occurs.

* * * * *